(12) United States Patent
Yeung et al.

(10) Patent No.: US 9,438,225 B1
(45) Date of Patent: Sep. 6, 2016

(54) HIGH EFFICIENCY HALF-CROSS-COUPLED DECOUPLING CAPACITOR

(71) Applicant: APPLIED MICRO CIRCUITS CORPORATION, Sunnyvale, CA (US)

(72) Inventors: Alfred Yeung, Fremont, CA (US); Ronen Cohan, Sunnyvale, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 0 days.

(21) Appl. No.: 14/736,882

(22) Filed: Jun. 11, 2015

(51) Int. Cl.
*H03K 17/16* (2006.01)

(52) U.S. Cl.
CPC .................................. *H03K 17/162* (2013.01)

(58) Field of Classification Search
None
See application file for complete search history.

(56) References Cited

U.S. PATENT DOCUMENTS

| 5,266,848 | A | * | 11/1993 | Nakagome | H03K 3/356017 327/306 |
|---|---|---|---|---|---|
| 5,587,333 | A | | 12/1996 | Johansson et al. | |
| 5,606,197 | A | | 2/1997 | Johansson et al. | |
| 5,883,423 | A | * | 3/1999 | Patwa | H01L 27/0925 257/532 |
| 6,888,235 | B2 | | 5/2005 | Lopata et al. | |
| 7,489,035 | B2 | | 2/2009 | Song et al. | |
| 7,719,310 | B2 | * | 5/2010 | Yokoi | H01L 27/0629 326/21 |
| 8,631,381 | B2 | | 1/2014 | Dai et al. | |
| 8,862,435 | B2 | | 10/2014 | Spanier et al. | |
| 8,949,102 | B2 | | 2/2015 | Dai et al. | |
| 8,976,804 | B1 | | 3/2015 | Shumarayev et al. | |
| 9,029,173 | B2 | | 5/2015 | Or-Bach | |
| 2009/0207552 | A1 | * | 8/2009 | Frederick, Jr. | H01G 4/35 361/306.2 |

FOREIGN PATENT DOCUMENTS

| JP | 08-102652 | 4/1996 |
|---|---|---|
| JP | 08-307229 | 11/1996 |
| JP | 09-093111 | 4/1997 |
| JP | 09-148909 | 6/1997 |
| JP | 11-191729 | 7/1999 |

OTHER PUBLICATIONS

International Search Report & Written Opinion for PCT Application Serial No. PCT/US2015/042798, mailed Apr. 8, 2016, 11 pages.

* cited by examiner

*Primary Examiner* — Long Nguyen
(74) *Attorney, Agent, or Firm* — Amin, Turocy & Watson LLP

(57) ABSTRACT

A decoupling capacitor circuit design facilitates high operational frequency without sacrificing area efficiency. In order to disassociate the sometimes opposing design criteria of high operational frequency and area efficiency, a p-channel field effect transistor (PFET) and an n-channel field effect transistor are connected in a half-cross-coupled (HCC) fashion. The HCC circuit is then supplemented by at least one area efficient capacitance (AEC) device. The half-cross-coupled transistors address the high frequency design requirement, while the AEC device(s) address the high area efficiency requirement. The design eliminates the undesirable trade-off between operating frequency and area efficiency inherent in some conventional DCAP designs.

20 Claims, 14 Drawing Sheets

PRIOR ART    FIG. 2

HIGH EFFICIENCY HALF-CROSS-COUPLED DECOUPLING CAPACITOR

TECHNICAL FIELD

The subject disclosure relates generally to electrical design, and more particularly to a decoupling capacitor circuit design for suppressing supply noise that provides high operational frequency and high area efficiency.

BACKGROUND

Decoupling capacitors (DCAPs) are an important component of power distribution networks (PDNs) for very-large-scale-integration (VLSI) designs. These decoupling capacitors shunt the supply noise caused by active circuit elements through the capacitor, thereby suppressing the supply noise observed by other elements of the circuit that are about to become active.

Several considerations are important to DCAP design, including high area efficiency, robust electrical properties, and properly targeted operational frequency. However, some DCAP designs are susceptible to damage from electro-static discharge (ESD) events, particularly as the transistor designs enter into ultra-deep sub-micron and finFET process nodes. Moreover, designs intended to render the DCAP more resistant to ESD damage are often hindered by an inherent trade-off between high area efficiency and high frequency operation.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a decoupling capacitor (DCAP) circuit is provided that yields high operational frequency without sacrificing area efficiency. In order to decouple the sometimes opposing design requirements of high operational frequency and area efficiency, a p-channel field effect transistor (PFET) and an n-channel field effect transistor are connected in a half-cross-coupled (HCC) fashion, and the resulting HCC circuit is supplemented by at least one area efficient capacitance (AEC) device. The half-cross-coupled FETs address the high frequency design requirement, while the AEC device(s) address the high area efficiency requirement. As a result of this configuration, the size of the HCC FETs can set the operating frequency of the circuit independently of the area efficiency, while the size of the AEC device(s) can set the area efficiency independently of the operating frequency. Thus, the DCAP design described herein eliminates the undesirable trade-off between operating frequency and area efficiency inherent in some conventional DCAP designs.

In one or more embodiments, a decoupling capacitor circuit is provided, comprising a first p-channel field effect transistor (PFET); a first n-channel field effect transistor (NFET); and at least one capacitive device, wherein a first PFET source and a first PFET body of the first PFET are connected to a voltage supply, a first NFET source and a first NFET body of the first NFET are connected to ground, the at least one capacitive device is connected to at least one of a first PFET gate of the first PFET or a first NFET gate of the first NFET, and inclusion of the at least one capacitive device increases an area efficiency of the decoupling capacitor circuit without changing a frequency response of the decoupling capacitor circuit.

Also, a method for suppressing power supply noise is provided, comprising connecting a first source and a first body of a first p-channel field effect transistor (PFET) to a voltage supply; connecting a second source and a second body of an n-channel field effect transistor (NFET) to ground; connecting a first drain of the first PFET to a first gate of the NFET; connecting a second drain of the NFET to a second gate of the first PFET; connecting a third drain, a third source, and a third body of a second PFET to the voltage supply; and connecting a third gate of the second PFET to the second gate of the first PFET.

Also, one or more embodiments provide a system for suppressing power supply noise, comprising a first p-channel field effect transistor (PFET), wherein a first PFET source and a first PFET body of the first PFET are connected to a voltage supply; a first n-channel field effect transistor (NFET), wherein a first NFET source and a first NFET body of the first NFET are connected to ground; and a second NFET, wherein a first PFET drain of the first PFET is connected to a first NFET gate of the first NFET, a first NFET drain of the first NFET is connected to a first PFET gate of the PFET, a second NFET drain, a second NFET source, and a second NFET body of the second NFET is connected to ground, and a second NFET gate of the second NFET is connected to the first NFET gate of the first NFET.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
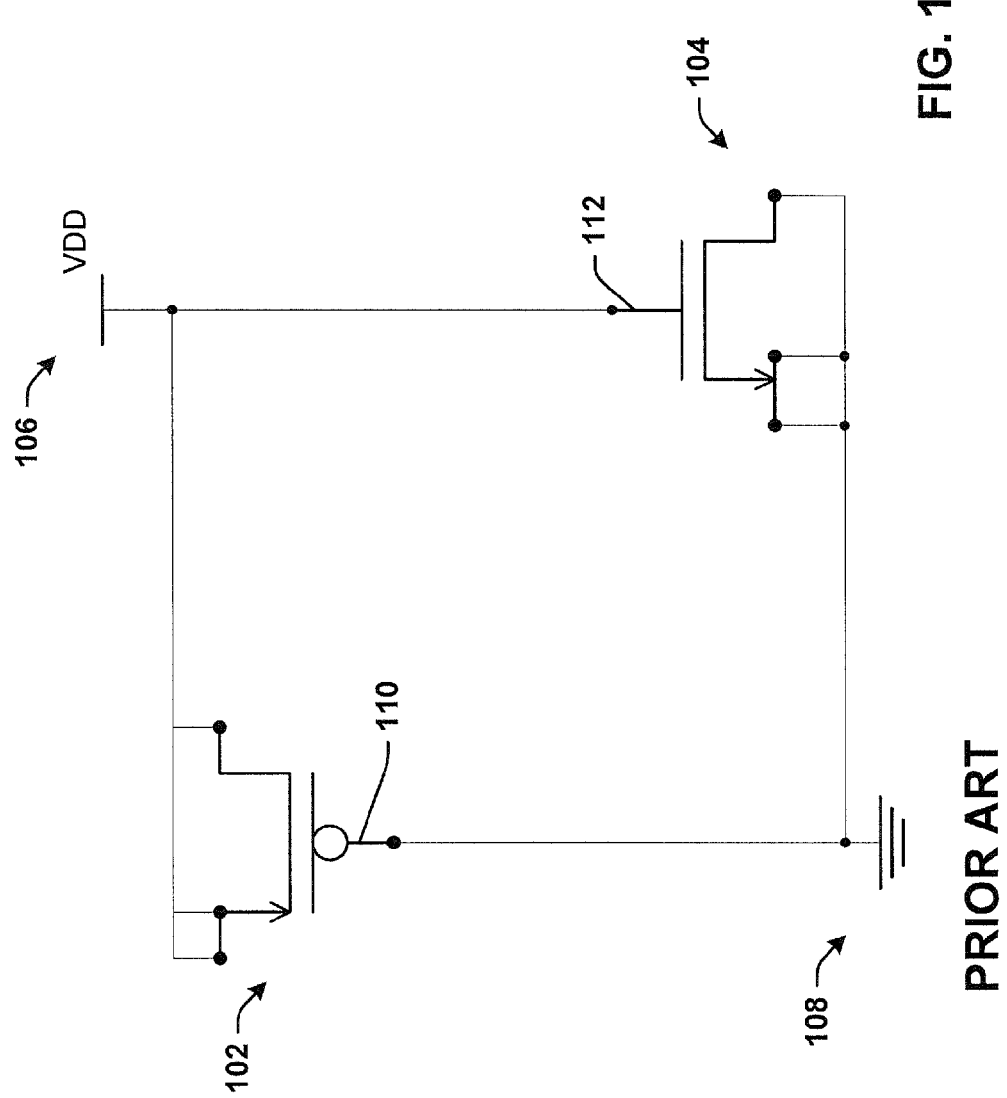
FIG. 1 is a circuit diagram illustrating an example approach to DCAP design.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

DCAPs are often used in power distribution networks of VLSI systems to suppress voltage supply noise or ripples induced by active circuit elements, thereby shielding other elements of the circuit from power supply voltage fluctuations that may damage the elements or impede their functions. Robust DCAP designs are characterized by high area efficiency, robust electrical properties, and properly targeted operational frequency. In the case of on-die DCAP design, the targeted operational frequency ranges from the operating frequency to the switching slew of the gates in the design, thus constituting the high operational frequency of the DCAP used in the power distribution network.

FIG. 1 is a circuit diagram illustrating one approach to DCAP design. According to this design approach, the drain, source, and body of the p-channel field effect transistor (PFET) 102 is directly tied to the supply voltage 106, and the drain, source, and body of the n-channel field effect transistor (NFET) 104 is tied to ground. The gate 110 of the PFET 102 is tied to ground, and the gate 112 of the NFET 104 is tied to the supply voltage 106. This design can decouple supply noise to high operating frequencies while being area efficient. However, as the transistor designs enter into ultra-deep sub-micron and finFET process nodes, the gate oxides become exceedingly thin. Consequently, the design depicted in FIG. 1 can become vulnerable to electrostatic discharge (ESD) events that may cause damage to the gate oxide and short out the supply and ground nodes. Since the gates 110 and 112 are directly connected to the supply and ground nodes, the design depicted in FIG. 1 may not be able to tolerate extreme ESD events even in the presence of ESD clamps. Designs that use metal gate material rather than poly-silicon are particularly susceptible to this problem.

Figure 2:
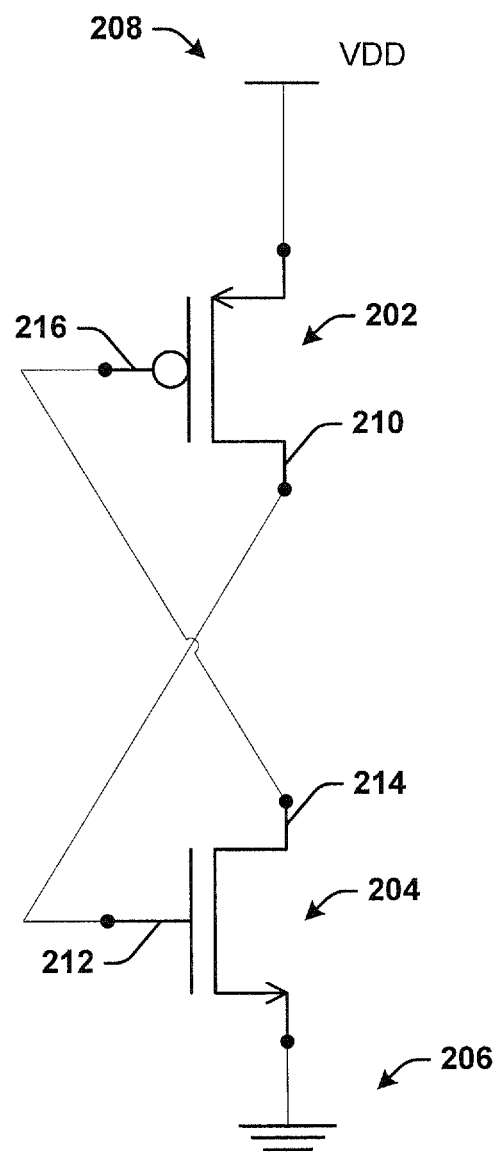
FIG. 2 is a circuit diagram illustrating an example half-cross-coupled DCAP design approach.

FIG. 2 is a circuit diagram illustrating another DCAP design approach that attempts to address this issue by tying the source and body of the PFET 202 to the supply voltage 208 and the source and body of the NFET 204 to ground 206, while connecting the drain and gate nodes of the PFET and NFET in a half-cross-coupled (HCC) fashion. That is, the drain 210 of PFET 202 is connected to the gate 212 of NFET 204, while the drain 214 of NFET 204 is connected to the gate 216 of PFET 202. This design provides a resistive path from the supply voltage and ground nodes to the gate through device channels, thereby protecting the gate oxide during an ESD event until the ESD clamp can shunt the excess charge.

However, using the design depicted in FIG. 2, it is difficult to achieve both high area efficiency and high frequency operation. This is because the HCC connectivity places these two design targets in direct conflict. For example, to achieve high area efficiency the PFET 202 and NFET 204 would require large channels to maximize the gate area. However, these large channels would add resistance to the decoupling path, thereby limiting the type of high frequency decoupling the capacitor circuit may achieve. If the channel lengths were reduced in the PFET 202 and NFET 204 to address this concern, the area efficiency would be penalized.

Moreover, a large channel for the design depicted in FIG. 2 will result in a high start-up time. This high start-up time is due to a "dead" zone in which the HCC nodes are brought up in states opposite to the values they require for the DCAP to function, and the design depends on the device leakage of the two FETS 202 and 204 to set the correct state values. A large channel will reduce this device leakage, resulting in a large increase in start-up time before the DCAP will be useful.

Figure 3:
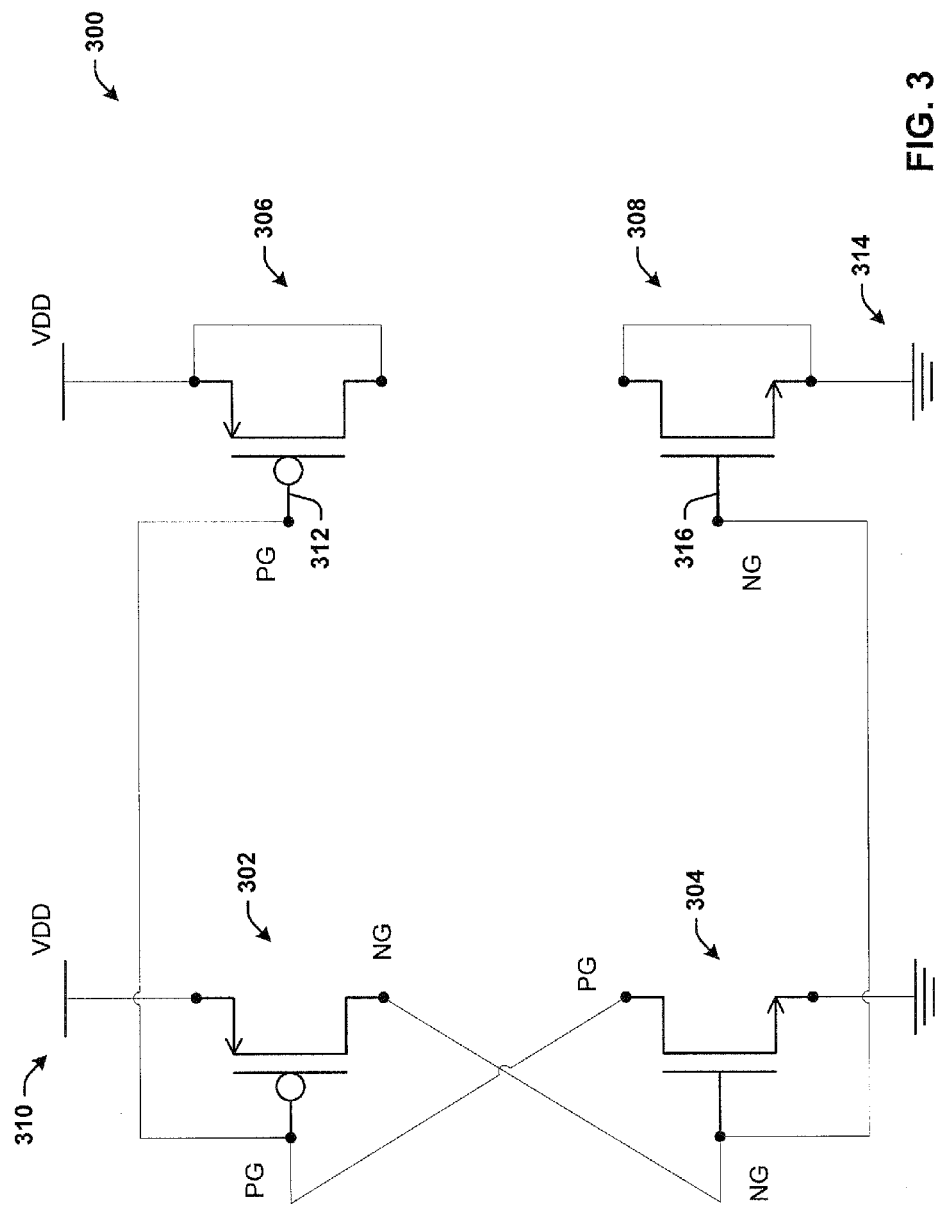
FIG. 3 is a circuit diagram of an example, non-limiting DCAP design that provides high area efficiency and high frequency operation.

To address these and other issues, one or more embodiments described herein provide a DCAP circuit design that maintains the high frequency operation offered by the HCC DCAP's electrical properties, while also achieving high area efficiency. FIG. 3 is a circuit diagram of an example DCAP circuit 300 that provides high area efficiency and high frequency operation. This design includes a PFET 302 and an NFET 304 connected in an HCC configuration, and area efficient capacitance (AEC) devices 306 and 308 that serve as an area efficiency decoupling capacitor. The AEC devices 306 and 308 can comprise, for example, a second PFET and a second NFET, respectively. With AEC devices 306 and 308 in place, the HCC devices can be optimized to provide a high frequency response without being limited by the conflicting design requirements of high area efficiency.

According to this design, the drain, source, and body of PFET AEC device 306 are connected to the supply voltage 310, while the gate 312 is connected to the PG node produced by the HCC connections. The drain, source, and body of NFET AEC device 308 is connected to ground 314, while the gate 316 is connected to the NG node produced by the HCC connections.

The circuit 300 depicted in FIG. 3 allows the device channel length of the HCC devices (PFET 302 and NFET 304)—and thus the corresponding resistance of the decoupling path through the PFET and NFET—to be kept low, thereby providing high frequency supply noise decoupling. Keeping the device channel length low also increases leakage in the HCC devices, thereby keeping start-up times low for scenarios in which the HCC connectivity is initialized to the incorrect states.

Whereas the HCC devices 302 and 304 achieve high frequency operation, the AEC devices 306 and 308 can be optimized to provide high area efficiency. In this regard, the AEC devices 306 and 308 can be sized to provide high area efficiency without changing the channel length (and resistance) of the decoupling path through the PFET 302 and NFET 304, and thus without changing the operating frequency of the circuit 300. In some cases, optimizing the AEC devices 306 and 308 for high area efficiency corresponds to having a large length (L). By satisfying the high frequency operation requirement using the HCC devices 302 and 304, and the high area efficiency requirement using the AEC devices 306 and 308, the design depicted in FIG. 3 effectively unlocks the high frequency component from the area efficiency component, allowing the design to be optimized to address high frequency applications without sacrificing area efficiency.

Figure 4:
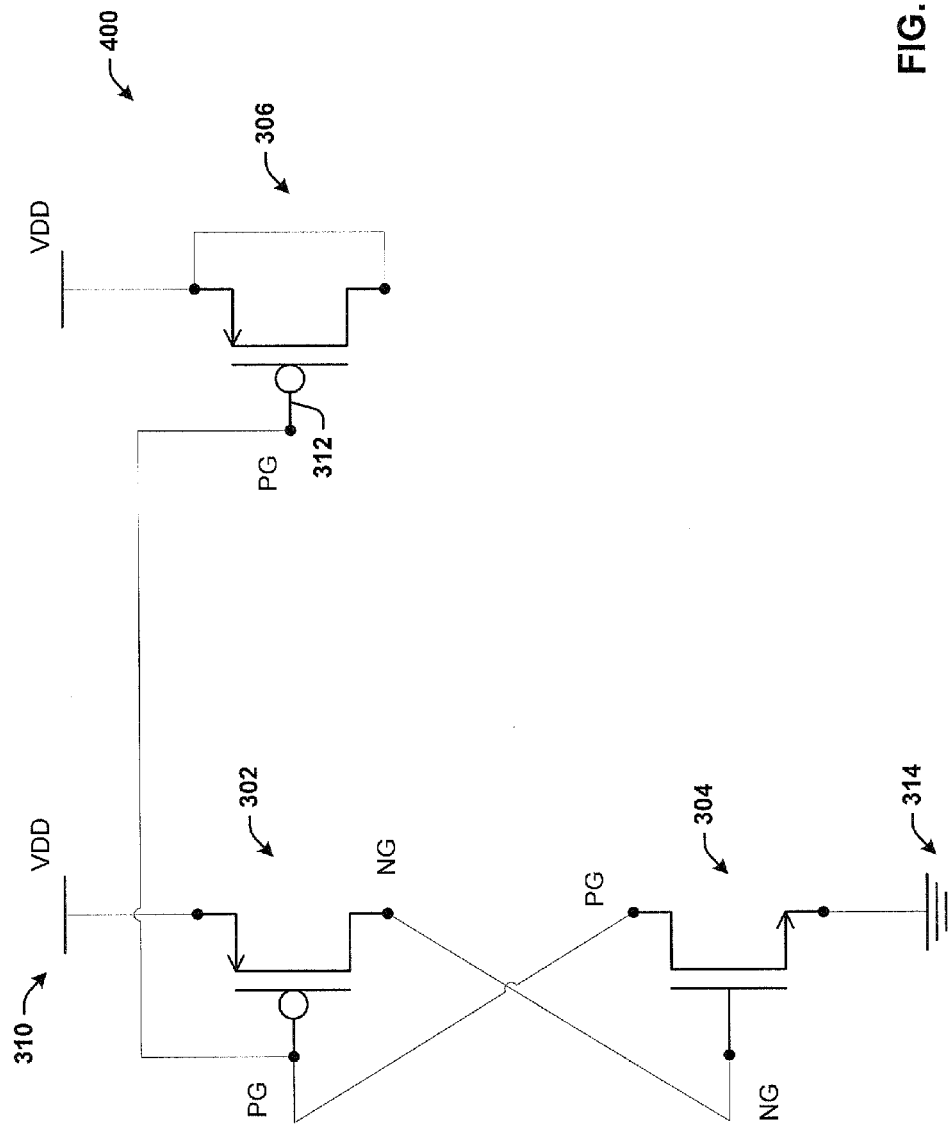
FIG. 4 is a circuit diagram of an example, non-limiting DCAP design that uses a single PFET AEC device.
Figure 5:
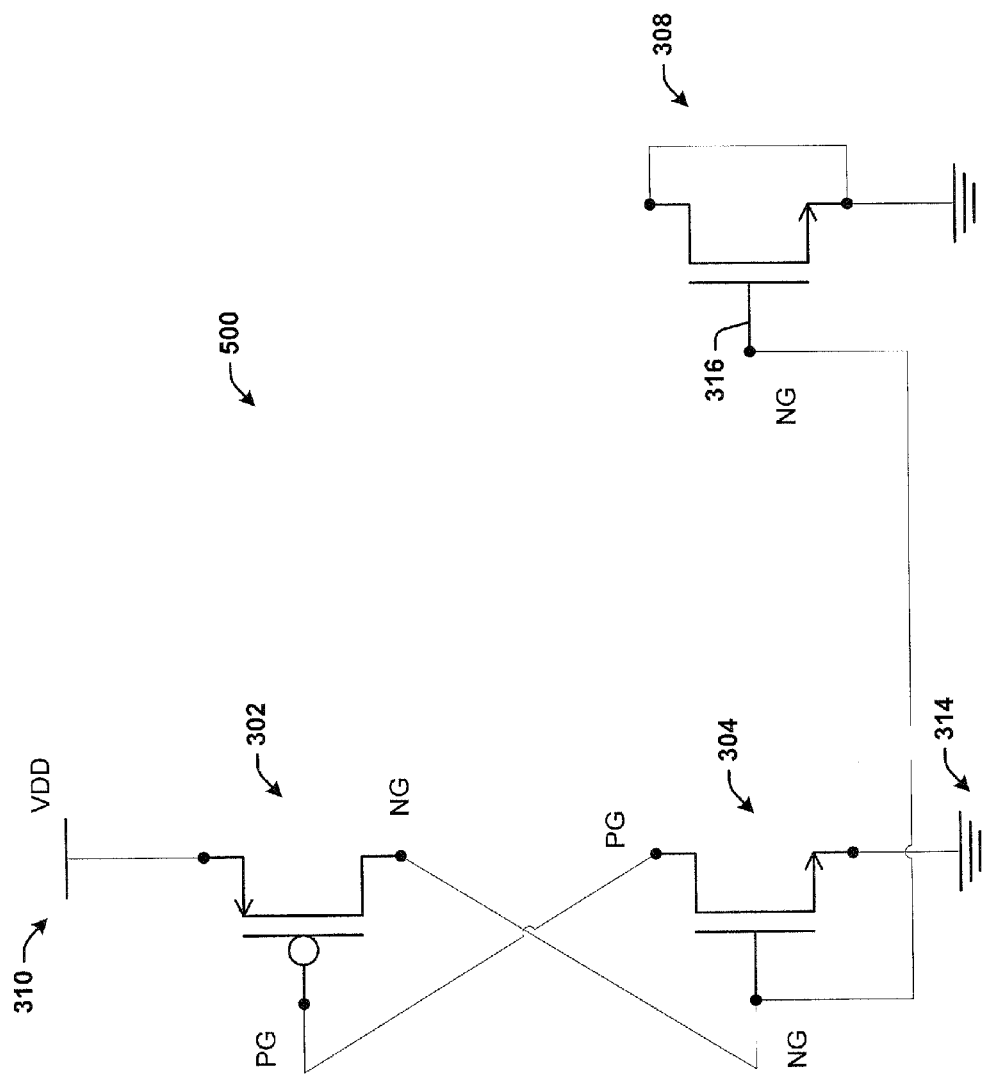
FIG. 5 is a circuit diagram of an example, non-limiting DCAP design that uses a single NFET AEC device.

Although circuit 300 includes two AEC devices 306 and 308 corresponding to the PFET 302 and NFET 304, respectively, some embodiments may include only one AEC device. FIG. 4 illustrates an embodiment in which only the PFET AEC device 306 is connected to the HCC circuit (omitting the NFET AEC device 308), while FIG. 5 illustrates an embodiment in which only the NFET AEC device 308 is connected (omitting the PFET AEC device 306).

Figure 6:
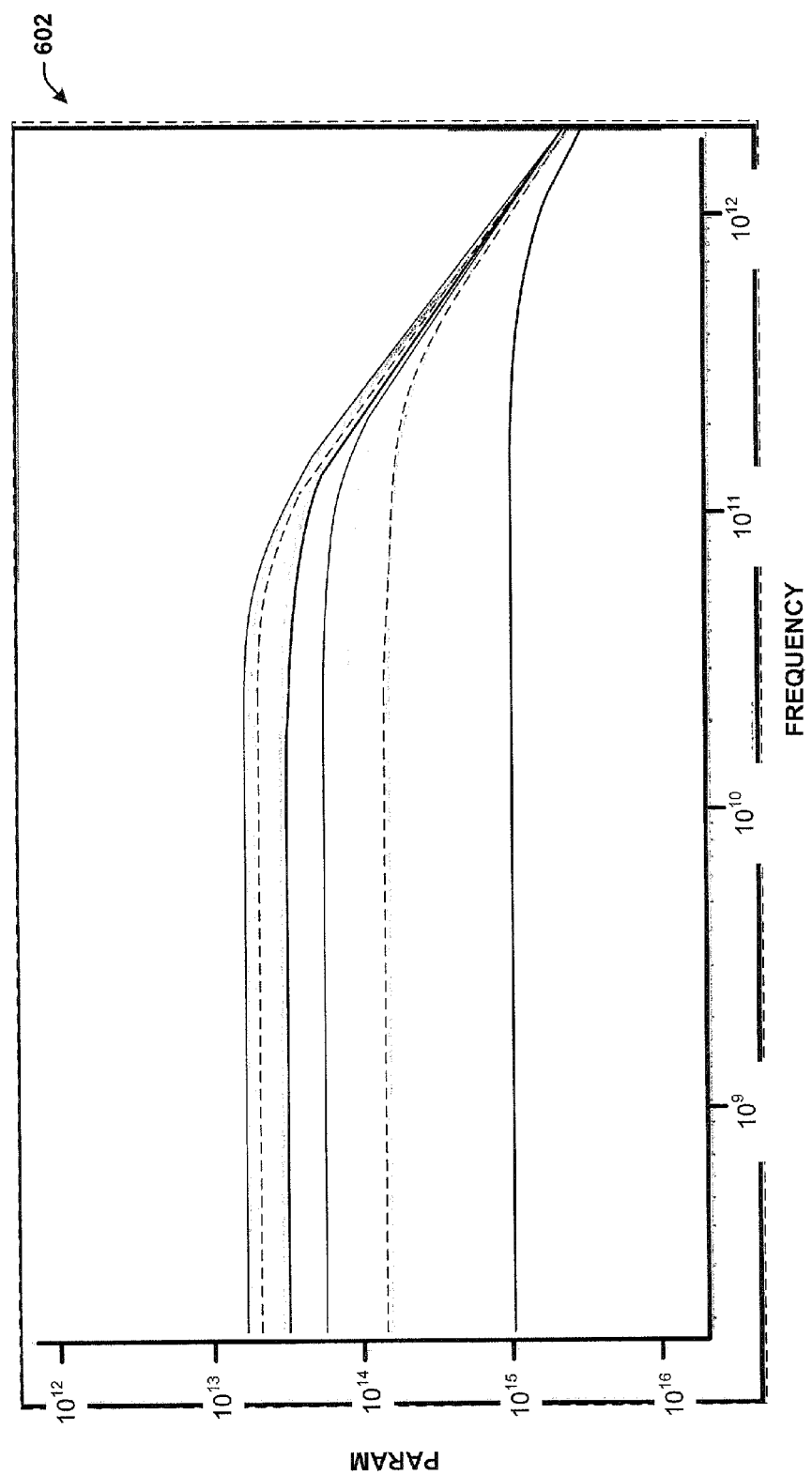
FIG. 6 is a graph illustrating the frequency response for the DCAP circuit illustrated in FIG. 3 for various sizes of AEC devices.

FIG. 6 is a graph 602 illustrating the frequency response for circuit 300 for various sizes of AEC devices 306 and 308. Each plot of graph 602 represents the frequency response for a given size of AEC devices 306 and 308, with the sizes of the HCC devices 302 and 304 kept constant for each plot. For each scenario, the roll-off frequency ω—that is, the frequency at which the capacitance of circuit 300 loses its effectiveness—is characterized by 1/(RC), where R is the resistance of the decoupling path determined by the size of the HCC devices 302 and 304, and C is the capacitance determined by the size of the AEC devices 306 and 308. As can be seen, as the capacitance of the AEC devices 306 and 308 increases, the roll-off frequency ω decreases. As a general design consideration, as the sizes of the AEC devices 306 and 308 increase, the HCC devices 302 and 304 can also be increased in order keep up with the increased capacitance of the AEC devices and thereby maintain high frequency supply noise decoupling. In general, the ratio between the sizes of the HCC devices 302 and 304 to the capacitance on the AEC devices 306 and 308 determines the degree of high frequency operation.

Figure 7:
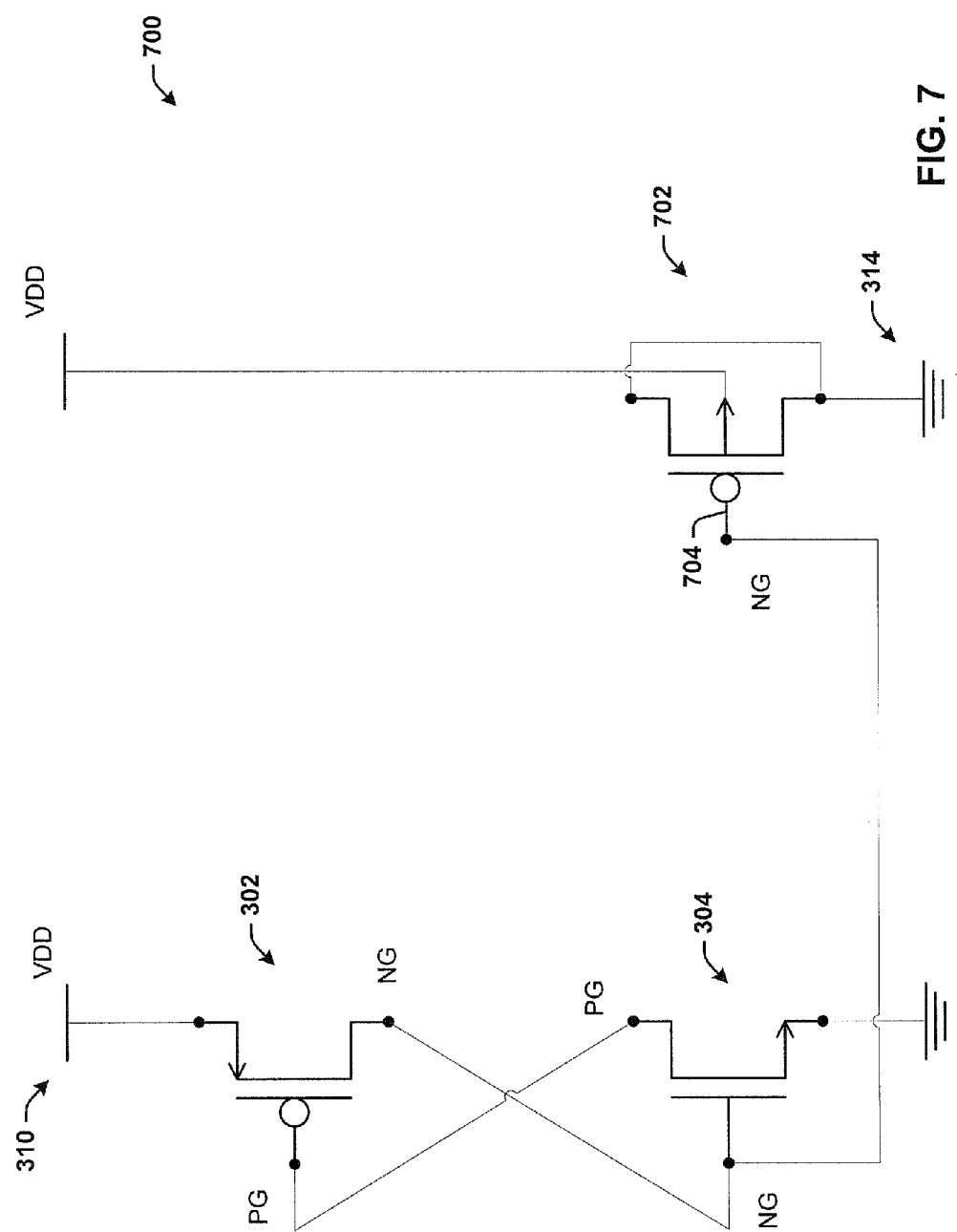
FIG. 7 is a circuit diagram of an example, non-limiting DCAP design that includes an AEC device comprising a PFET having a gate tied to the NG node, a source and drain tied to ground, and a body tied to VDD.
Figure 8:
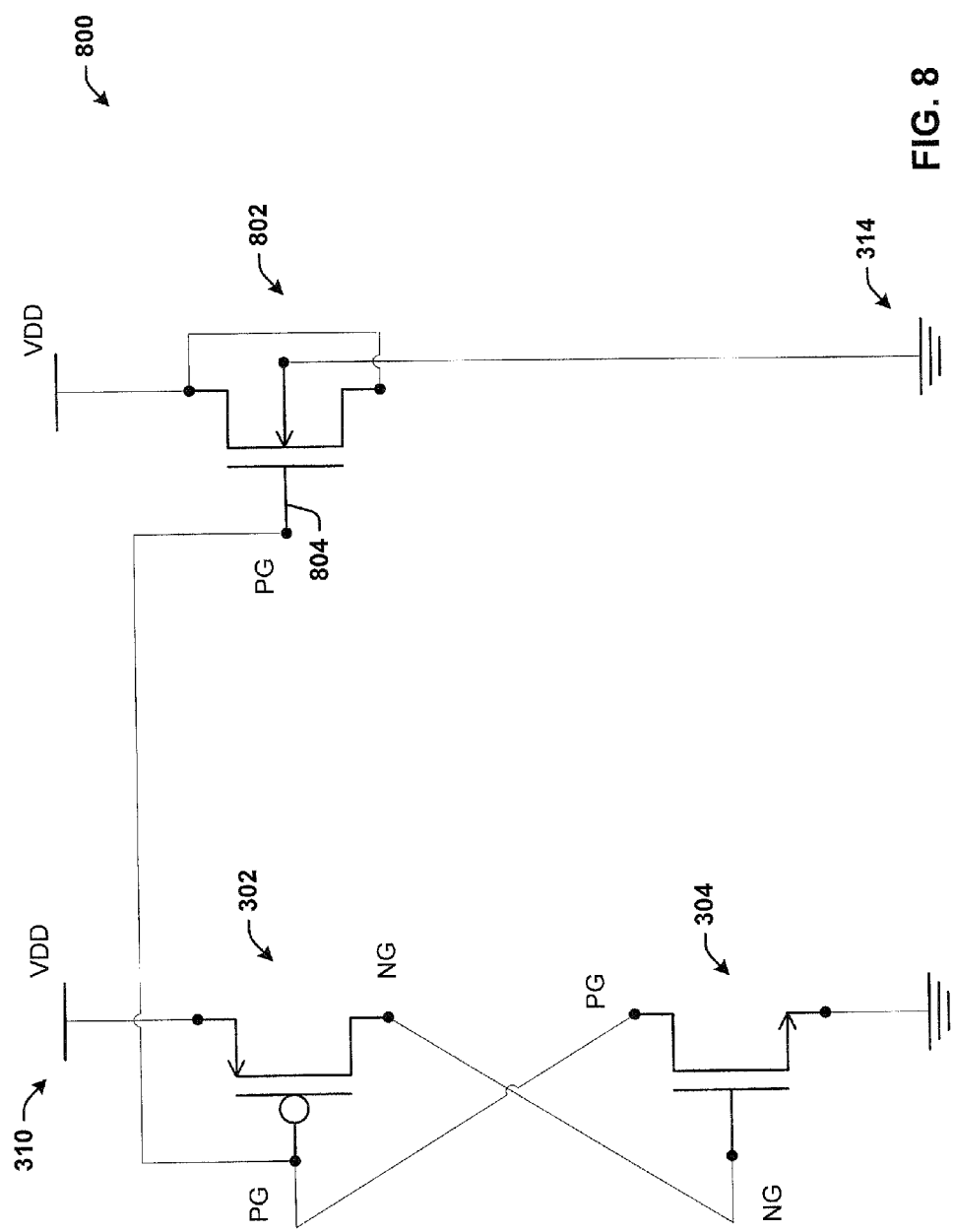
FIG. 8 is a circuit diagram of an example, non-limiting DCAP design that includes an AEC device comprising an NFET having a gate tied to node PG, a drain and source tied to VDD, and body tied to ground.
Figure 9:
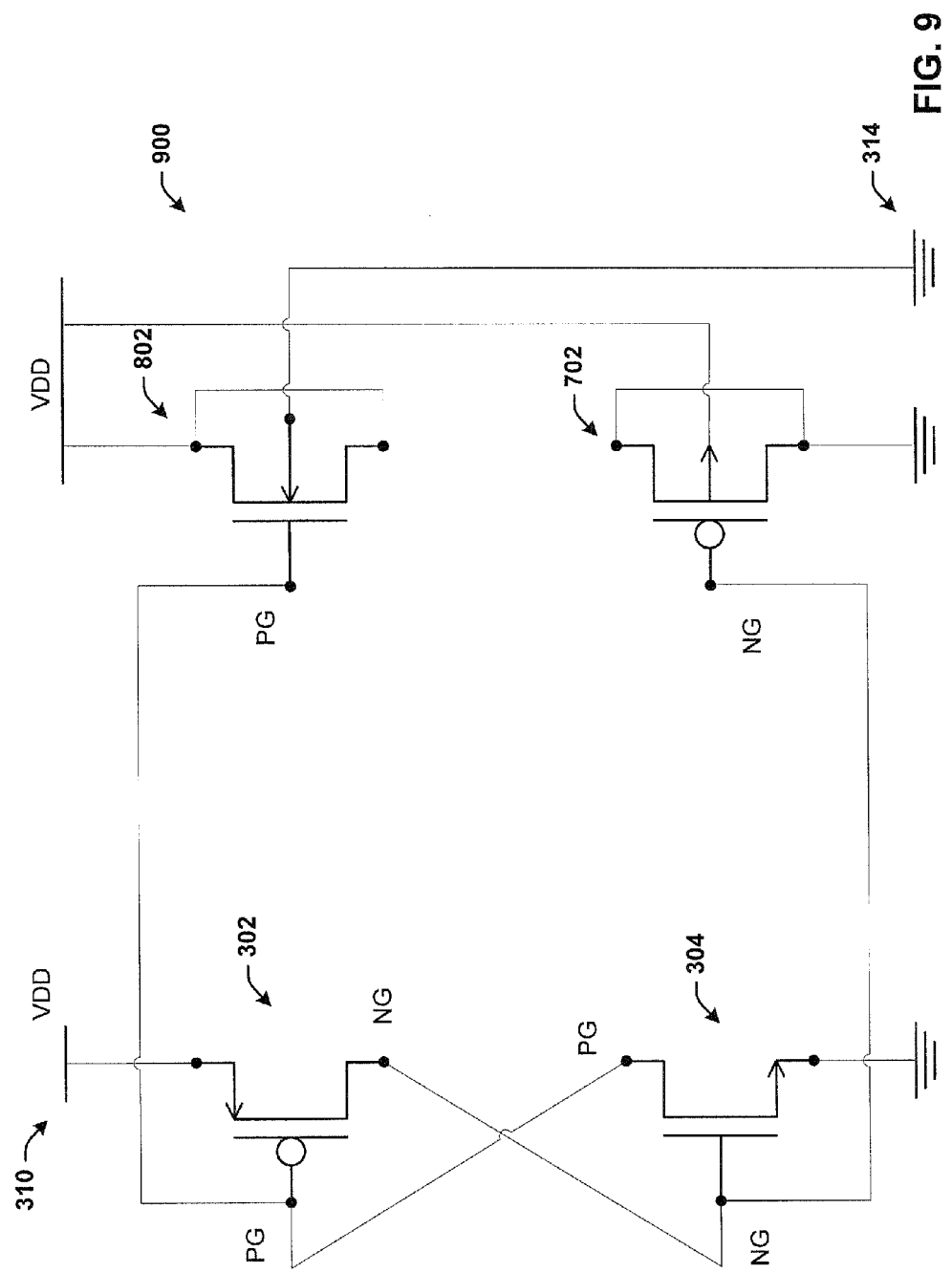
FIG. 9 is a circuit diagram of an example, non-limiting DCAP design that includes a PFET AEC device as illustrated in FIG. 7 and an NFET AEC device as illustrated in FIG. 8.

In addition to AEC devices 306 and 308, other types of AEC devices are also within the scope of one or more embodiments of this disclosure. For example, FIG. 7 is a circuit diagram of an example DCAP circuit 700 that includes an AEC device 702 comprising a PFET having gate 704 tied to the NG node, source and drain tied to ground 314, and body tied to VDD 310. FIG. 8 is a circuit diagram of an example DCAP circuit 800 that includes an AEC device 802 comprising an NFET having gate 804 tied to node PG, drain and source tied to VDD 310, and body tied to ground 314. FIG. 9 is a circuit diagram of an example DCAP circuit 900 that includes both AEC devices 702 and 802.

Figure 10:
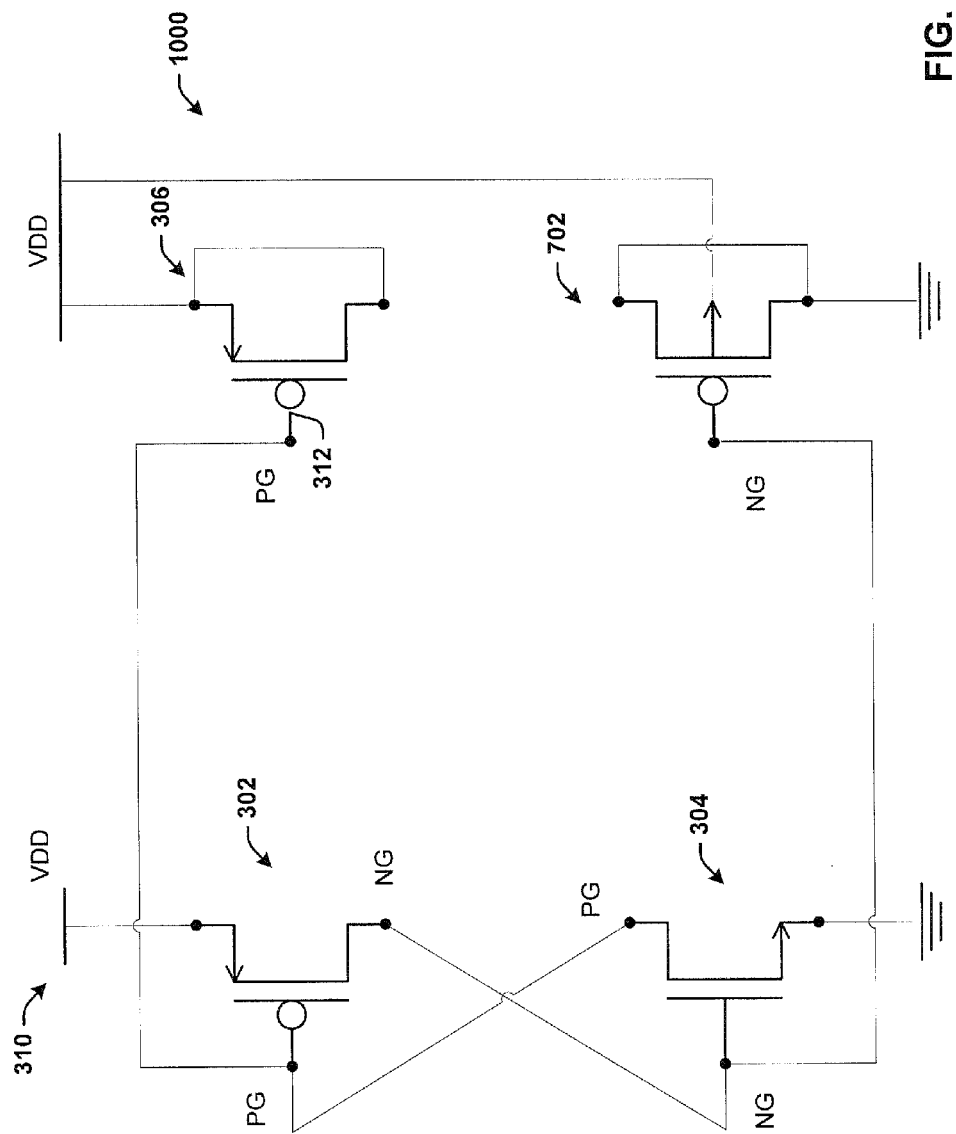
FIG. 10 is a circuit diagram of an example, non-limiting DCAP design that includes a first PFET AEC device as illustrated in FIG. 4 and a second PFET AEC device as illustrated in FIG. 7.
Figure 11:
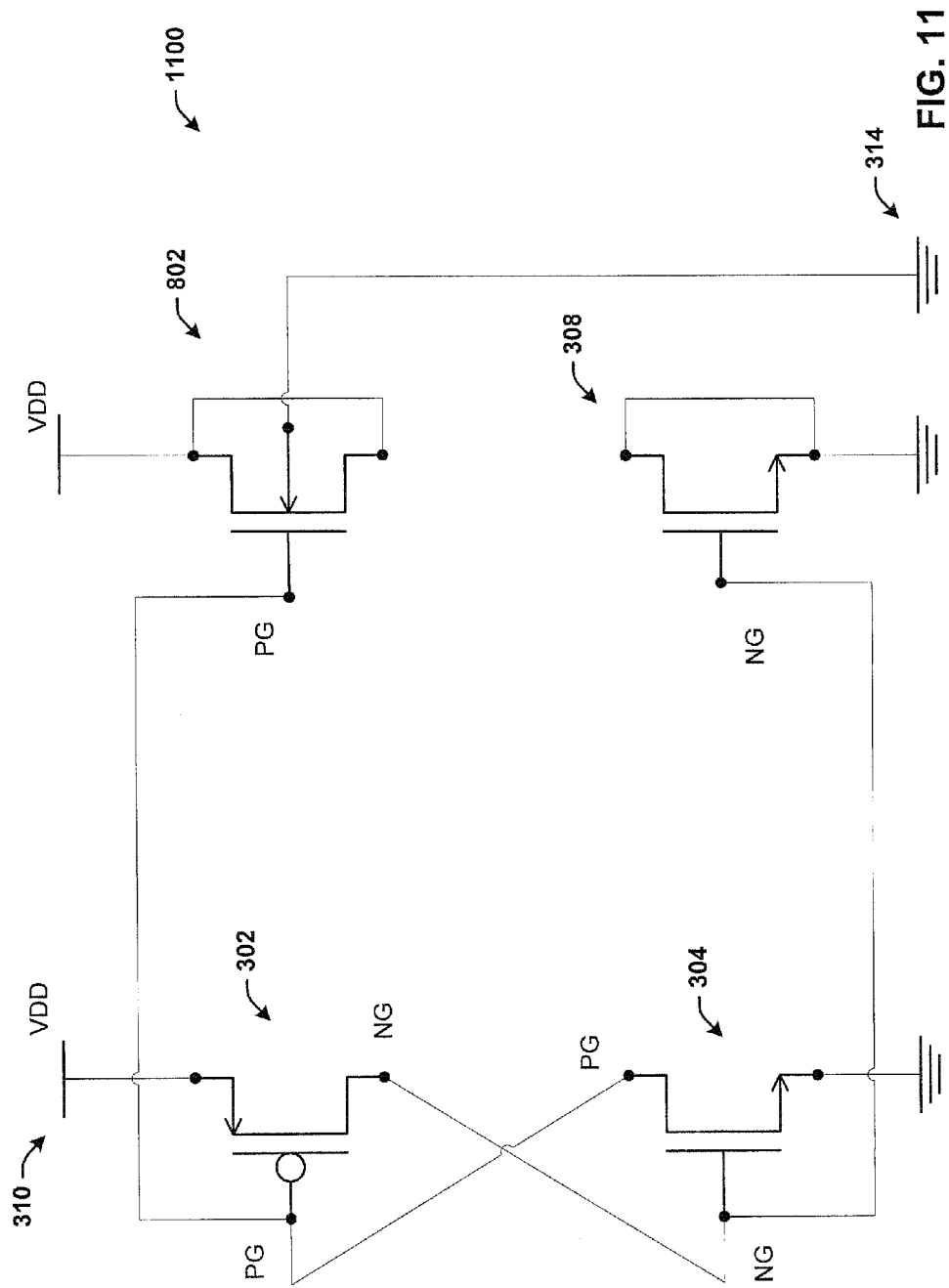
FIG. 11 is a circuit diagram of an example, non-limiting DCAP design that includes a first NFET AEC device as illustrated in FIG. 5 and a second NFET AEC device as illustrated in FIG. 8.

AEC devices 306, 308, 702, and 802 can be combined in any permutation to yield a DCAP circuit. For example, FIG. 10 is a circuit diagram of an example DCAP circuit 1000 that includes AEC device 702 and AEC device 306, while FIG. 11 is a circuit diagram of an example DCAP circuit 1100 that includes AEC device 802 and AEC device 308.

Figure 12:
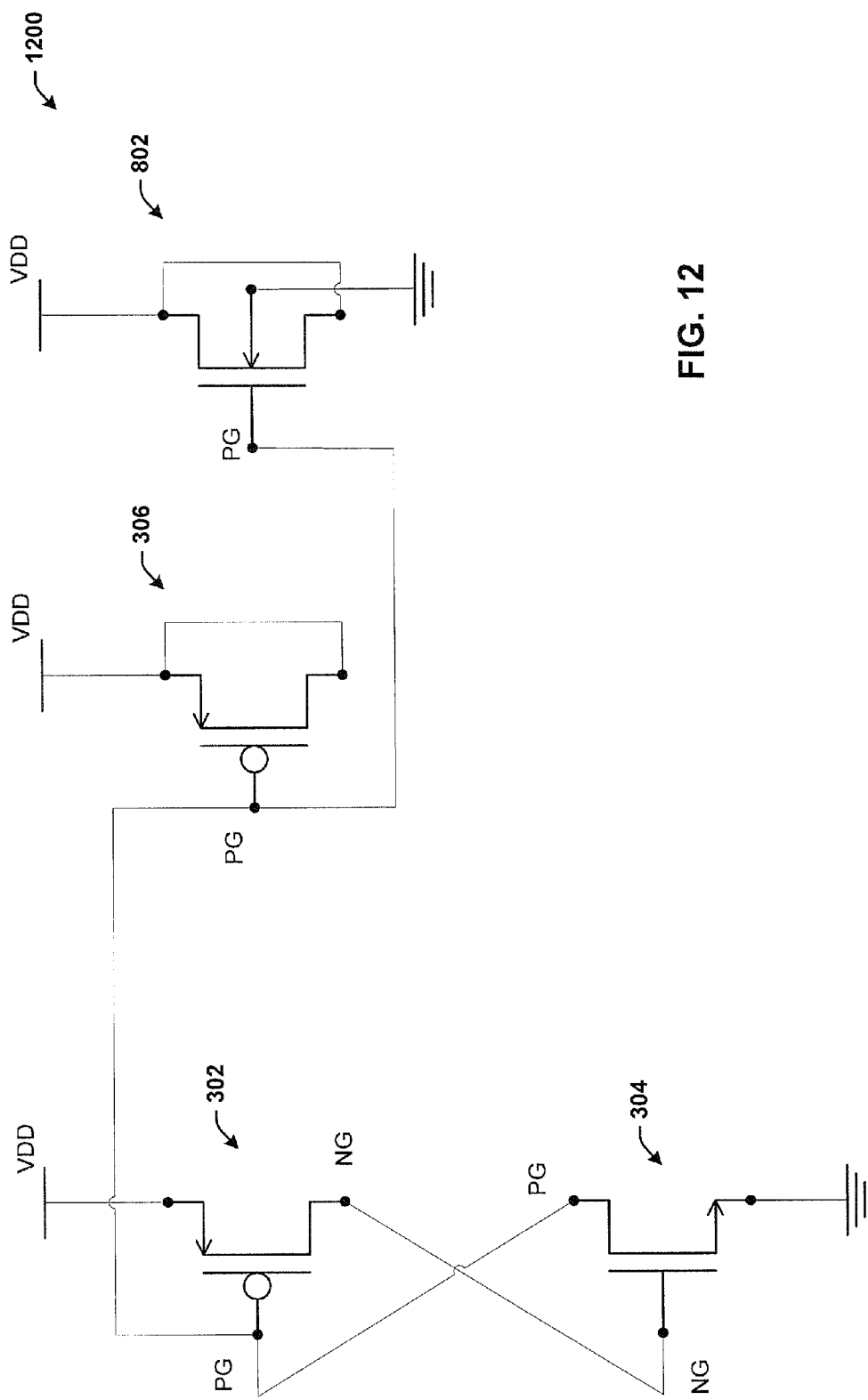
FIG. 12 is a circuit diagram of an example, non-limiting DCAP design that includes a PFET AEC device as illustrated in FIG. 4 and an NFET AEC device as illustrated in FIG. 8.
Figure 13:
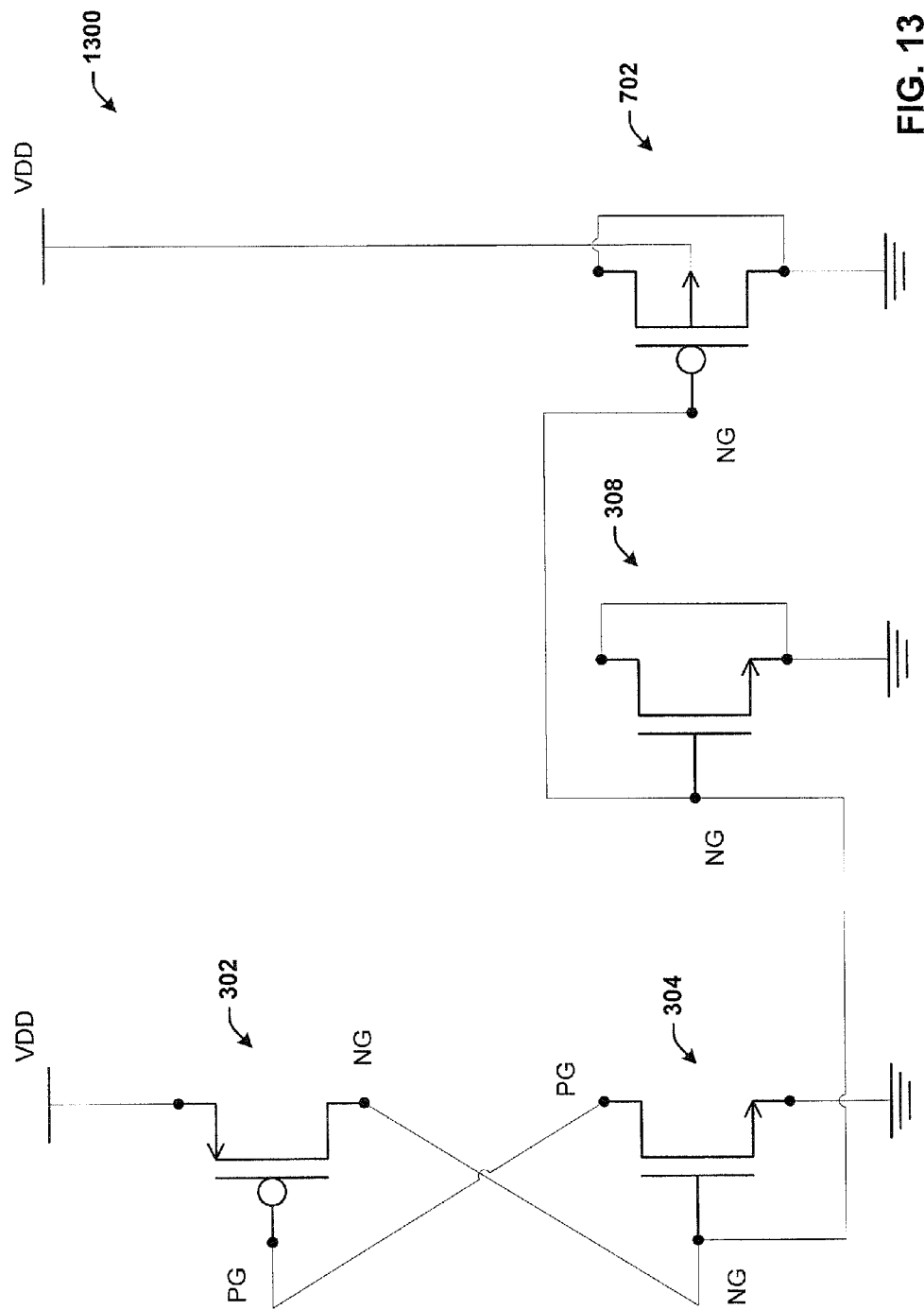
FIG. 13 is a circuit diagram of an example, non-limiting DCAP design that includes an NFET AEC device as illustrated in FIG. 5 and a PFET AEC device as illustrated in FIG. 7.

FIG. 12 is a circuit diagram of another example DCAP circuit 1200 that includes AEC devices 306 and 802. In this example, the gates of both AEC devices are connected to the PG node. FIG. 13 is a circuit diagram of yet another example DECAP circuit 1300 that includes AEC devices 308 and 702. In this example, the gates of both AEC devices are connected to the NG node.

The decoupling capacitor circuits described above and illustrated in FIGS. 3-5 and FIGS. 7-13 can be embodied using any suitable FET implementation. For example, any of circuits 300, 400, 500, 700, 800, 900, 1000, 1100, 1200, and/or 1300 can be embodied as an integrated circuit that can be used to provide supply noise suppression for a power distribution network of a VLSI system. Any of circuits 300, 400, 500, 700, 800, 900, 1000, 1100, 1200, or 1300 can be implemented as an on-chip component of such VLSI systems, or as an off-chip component embodied on a dedicated integrated circuit that provides supply voltage suppression for a VLSI system residing on a separate chip. In other embodiments, any of circuits, 400, 500, 700, 800, 900, 1000, 1100, 1200, or 1300 may be constructed using solid state components.

Figure 14:
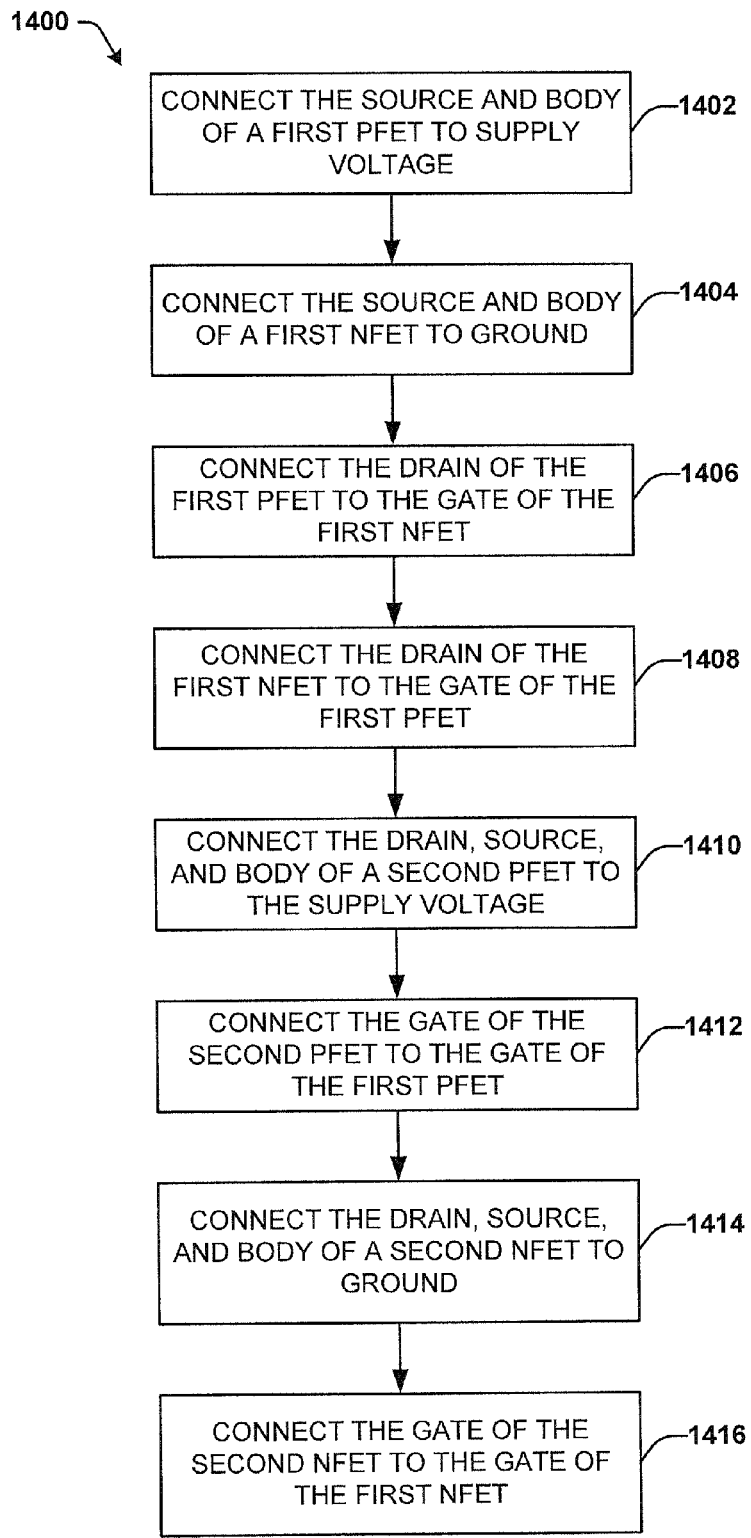
FIG. 14 illustrates a flow diagram of an example, non-limiting embodiment for manufacturing a decoupling capacitor (DCAP) circuit.

FIG. 14 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 14, a flow diagram of an example, non-limiting embodiment for assembling a decoupling capacitor (DCAP) circuit is shown. The DCAP circuit can be used, for example as a component of power distribution networks (PDNs). Method 1400 can begin at block 1402, where the source and body of a first p-channel field effect transistor (PFET) is connected to a supply voltage (e.g., a supply voltage of a power distribution network or other system requiring supply noise suppression). At block 1404, the source and body of a first n-channel field effect transistor (NFET) is connected to ground. At block 1406, the drain of the first PFET is connected to the gate of the first NFET. At block 1408, the drain of the first NFET is connected to the gate of the first PFET.

At block 1410 the drain, source, and body of a second PFET is connected to the supply voltage. At block 1412, the gate of the second PFET is connected to the gate of the first PFET. At block 1414, the drain, source, and body of a second NFET is connected to ground. At block 1416, the gate of the second NFET is connected to the gate of the first NFET. The circuit yielded by blocks 1402-1416 can be used to suppress power supply noise, and can achieve high area efficiency as well as high frequency operation.

In some embodiments, either of the second PFET or the second NFET can be omitted from the circuit (see, e.g., FIGS. 4 and 5). That is, in some embodiments, blocks 1410 and 1412 can be omitted, while in other embodiments blocks 1414 and 1416 can be omitted.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A decoupling capacitor circuit, comprising:
    a first p-channel field effect transistor (PFET);
    a first n-channel field effect transistor (NFET); and
    at least one capacitive device,
    wherein
    a first PFET source and a first PFET body of the first PFET are connected to a voltage supply,
    a first NFET source and a first NFET body of the first NFET are connected to ground,
    the at least one capacitive device is connected to at least one of a first PFET gate of the first PFET or a first NFET gate of the first NFET, and
    inclusion of the at least one capacitive device increases an area efficiency of the decoupling capacitor circuit without changing a frequency response of the decoupling capacitor circuit.

2. The decoupling capacitor circuit of claim 1, wherein
    a first PFET drain of the first PFET is connected to the first NFET gate of the first NFET, and
    a first NFET drain of the first NFET is connected to the first PFET gate of the first PFET.

3. The decoupling capacitor circuit of claim 2, wherein the at least one capacitive device comprises a second PFET.

4. The decoupling capacitor circuit of claim 3, wherein
    a second PFET drain, a second PFET source, and a second PFET body of the second PFET are connected to the voltage supply, and
    a second PFET gate of the second PFET is connected to the first PFET gate of the first PFET.

5. The decoupling capacitor circuit of claim 2, wherein the at least one capacitive device comprises a second NFET.

6. The decoupling capacitor circuit of claim 5, wherein
    a second NFET drain, a second NFET source, and a second NFET body of the second NFET are connected to ground, and
    a second NFET gate of the second NFET is connected to the first NFET gate of the first NFET.

7. The decoupling capacitor circuit of claim 3, wherein
    a second PFET source and a second PFET drain of the second PFET are connected to ground,
    a second PFET body of the second PFET is connected to the voltage supply, and
    a second PFET gate of the second PFET is connected to the first NFET gate of the first NFET.

8. The decoupling capacitor circuit of claim 5, wherein
    a second NFET drain and a second NFET source of the second NFET are connected to the voltage supply,
    a second NFET body of the second NFET is connected to ground, and
    a second NFET gate of the second NFET is connected to the first PFET gate of the PFET.

9. The decoupling capacitor circuit of claim 1, wherein the voltage supply is a voltage supply of a power distribution network.

10. The decoupling capacitor circuit of claim 9, wherein the decoupling capacitor circuit is an on-chip component of a very-large-scale-integration (VLSI) system that comprises the power distribution network.

11. The decoupling capacitor circuit of claim 9, wherein the decoupling capacitor circuit is an off-chip component of a very-large-scale-integration (VLSI) system that comprises the power distribution network.

12. A method for suppressing power supply noise, comprising:
    connecting a first source and a first body of a first p-channel field effect transistor (PFET) to a voltage supply;
    connecting a second source and a second body of an n-channel field effect transistor (NFET) to ground;
    connecting a first drain of the first PFET to a first gate of the NFET;
    connecting a second drain of the NFET to a second gate of the first PFET;
    connecting a third drain, a third source, and a third body of a second PFET to the voltage supply; and
    connecting a third gate of the second PFET to the second gate of the first PFET.

13. The method of claim 12, wherein the NFET comprises a first NFET, and the method further comprises:
    connecting a fourth drain, a fourth source, and a fourth body of a second NFET to ground; and
    connecting a fourth gate of the second NFET to the first gate of the first NFET.

14. The method of claim 12, wherein the connecting the first source and the first body of the first PFET to the voltage supply comprises connecting to a voltage supply of a power distribution network.

15. A system for suppressing power supply noise, comprising:
    a first p-channel field effect transistor (PFET), wherein a first PFET source and a first PFET body of the first PFET are connected to a voltage supply;
    a first n-channel field effect transistor (NFET), wherein a first NFET source and a first NFET body of the first NFET are connected to ground; and
    a second NFET,
    wherein
    a first PFET drain of the first PFET is connected to a first NFET gate of the first NFET,
    a first NFET drain of the first NFET is connected to a first PFET gate of the PFET,
    a second NFET drain, a second NFET source, and a second NFET body of the second NFET is connected to ground, and
    a second NFET gate of the second NFET is connected to the first NFET gate of the first NFET.

16. The system of claim 15, further comprising a second PFET, wherein
    a second PFET drain, a second PFET source, and a second PFET body of the second PFET are connected to the voltage supply, and a second PFET gate of the second PFET is connected to the first PFET gate of the first PFET.

17. The system of claim 15, wherein inclusion of the second NFET increases an area efficiency of the system without increasing a channel length of the first PFET and the first NFET.

18. The system of claim 15, wherein the voltage supply is a voltage supply of a power distribution network of a very-large-scale-integration (VLSI) system.

19. The system of claim 18, wherein the system is an on-chip component of the VLSI system.

20. The system of claim 18, wherein the system is an off-chip component of the VLSI system.

\* \* \* \* \*

UNITED STATES PATENT AND TRADEMARK OFFICE
CERTIFICATE OF CORRECTION

PATENT NO. : 9,438,225 B1
APPLICATION NO. : 14/736882
DATED : September 6, 2016
INVENTOR(S) : Alfred Yeung et al.

It is certified that error appears in the above-identified patent and that said Letters Patent is hereby corrected as shown below:

On the title page in column 1, item (72) Inventors:

Alfred Yeung, Fremont, CA (US);
Ronen Cohan, Sunnyvale, CA (US)

It should read:

(72) Inventors:

Alfred Yeung, Fremont, CA (US);
Ronen Cohen, Sunnyvale, CA (US)

Signed and Sealed this
Twenty-fifth Day of October, 2016

Michelle K. Lee
*Director of the United States Patent and Trademark Office*